United States Patent [19]
Bai et al.

[11] Patent Number: 5,369,665
[45] Date of Patent: Nov. 29, 1994

[54] COHERENT TIME-DOMAIN DATA STORAGE WITH SPREAD-SPECTRUM DATA PULSE

[75] Inventors: Yu Sheng Bai, Palo Alto; Ravinder Kachru, Redwood City, both of Calif.

[73] Assignee: SRI International, Menlo Park, Calif.

[21] Appl. No.: 90,826

[22] Filed: Jul. 13, 1993

[51] Int. Cl.$^5$ ............................................. G11C 13/04
[52] U.S. Cl. ......................................... 375/1; 365/119
[58] Field of Search ............................ 365/119; 375/1

[56] References Cited

U.S. PATENT DOCUMENTS

| | | | |
|---|---|---|---|
| 4,101,976 | 7/1978 | Castro et al. | 365/119 |
| 4,459,682 | 7/1984 | Mossberg | 365/119 |
| 5,204,770 | 4/1993 | Kachru et al. | 365/119 X |

OTHER PUBLICATIONS

Bai et al., "Real–Time Optical Waveform Convolver/Cross Correlator," Applied Physics Letters, vol. 45, No. 7, (Oct. 1984), pp. 714.
Mossberg, "Time–Domain Frequency Selective Optical Data Storage," Optics Letters, vol. 77, (1982), p. 77.
Zhang et al., "Use of Phase–Noisy Laser Fields in the Storage of Optical Pulse Shapes in Inhomogeneously Broadened Absorbers," Optics Letters, vol. 16, (1991), p. 103.

Primary Examiner—Gilberto Barrón, Jr.
Attorney, Agent, or Firm—Elliot B. Aronson

[57] ABSTRACT

A method and apparatus for coherent time-domain optical data storage utilizing a randomizing phase modulation to increase storage capacity. A laser (10) generates write. read, and data pulses which are applied to an acousto-optic modulator (11), which modulates the pulses according to a modulation signal received from a radio-frequency modulator (12), and the modulated pulses are applied to the storage medium (13). The data signal to be recorded on the storage medium is subjected to spread-spectrum modulation, and in particular to pseudo-random phase modulation. The RF-modulator (12) modulates the write and read pulses with a frequency-chirping modulation and modulates the data pulse with the spread-spectrum modulated data signal before applying the respective pulses to the storage medium. The result is that a significantly longer data signal may be effectively recorded on the optical storage medium for a given characteristic de-phasing time of the medium.

7 Claims, 3 Drawing Sheets

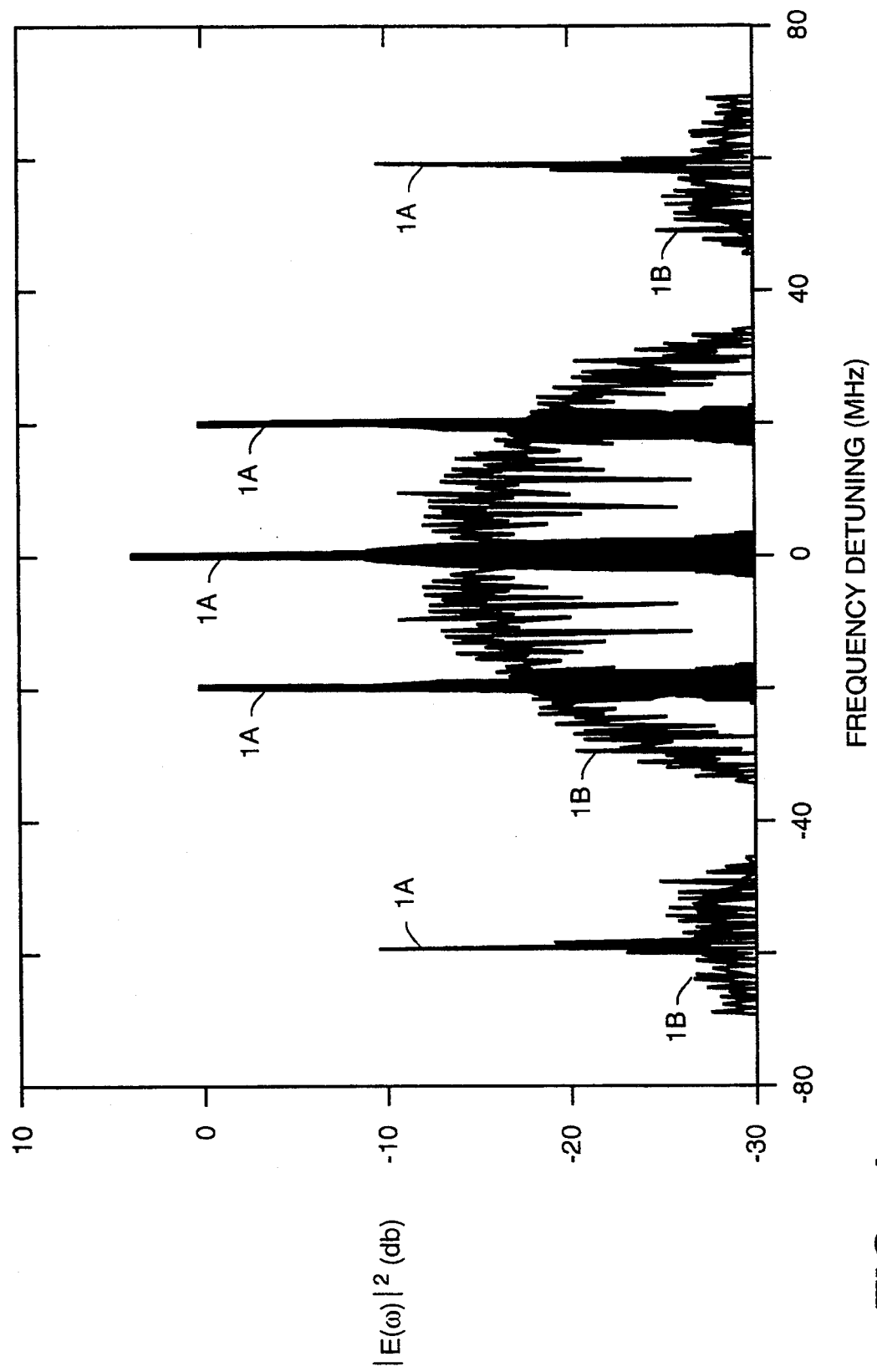
FIG._1

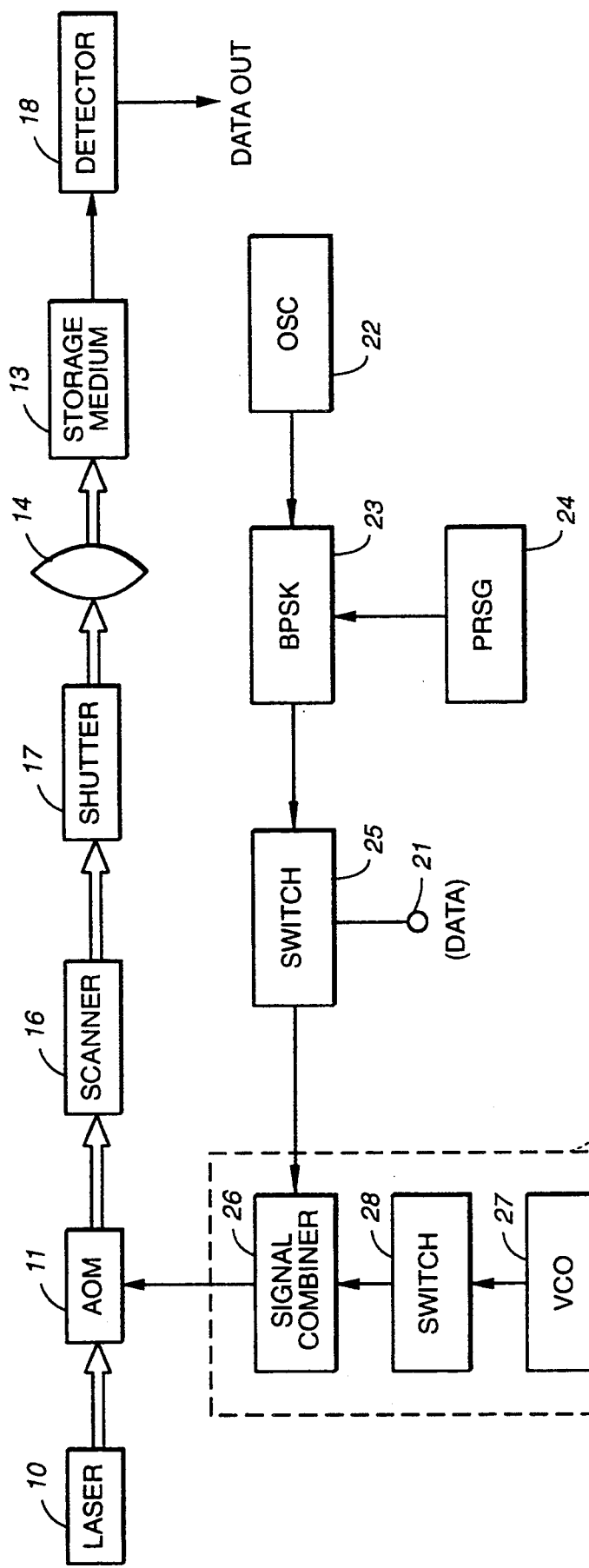
FIG._2

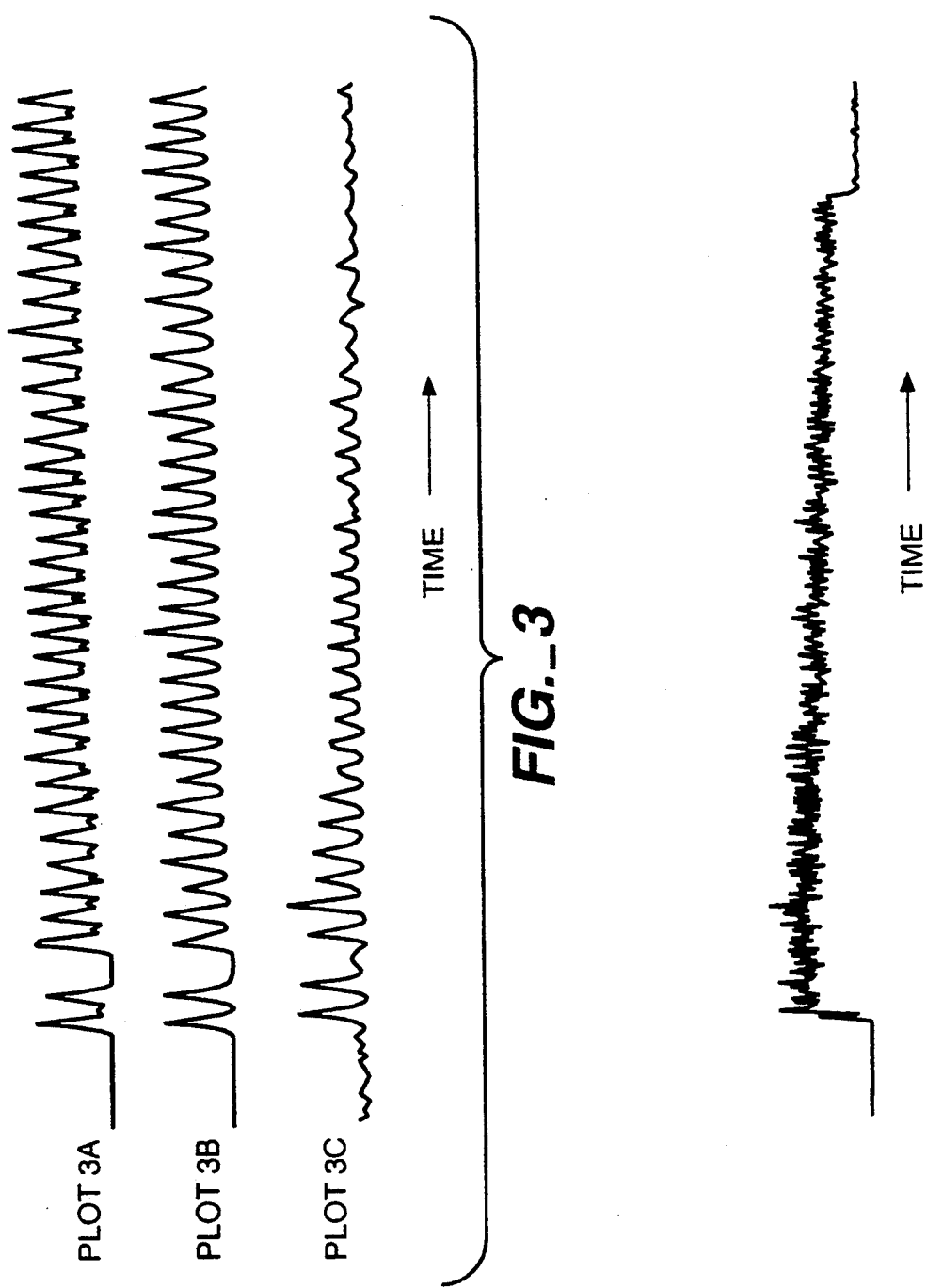

COHERENT TIME-DOMAIN DATA STORAGE WITH SPREAD-SPECTRUM DATA PULSE

This invention was made with Government support under Contract F30602-91-C-0102 awarded by the Air Force. The Government has certain rights in this invention.

BACKGROUND OF THE INVENTION

The present invention relates generally to optical memories and is more particularly directed to techniques for reading and writing data from and to coherent time-domain optical memories.

Optical memory refers generally to a data storage system that utilizes the properties of a light beam to store data in a storage medium and to retrieve the data from the medium. A light beam has a variety of properties that make it suited for storage and retrieval of data. A light beam may be focused to a very small and precise spatial extent, and this property is exploited in conventional two-dimensional optical memories to store data at geographically defined spatial addresses on the storage medium. Frequency-domain optical memories and coherent time-domain optical memories are examples of other types of optical memories that exploit, in addition, the frequency characteristics, or more generally the spectral characteristics, of the light beam to store and retrieve data at increased storage capacities.

In general, when a light beam impinges on a small spatial region of a storage medium, the medium will absorb the light over a broad band of frequencies. In the frequency-domain method a storage medium is chosen that absorbs incident light at a characteristic frequency or frequencies with an absorption profile that has been inhomogeneously broadened. The spectral properties of suitable materials are well known in the art and need not be described in detail here. To write data onto the storage medium at the small spatial region, a laser beam with very narrow bandwidth compared with the absorption profile of the medium is focused on the region over a sequence of discrete frequencies within the absorption profile. Each such discrete frequency serves as a separate channel for recording a data bit in the spatial region. The beam interacts with the medium at each frequency to produce a gap, or more figuratively to burn a "hole," in the absorption profile depending on whether a data bit is a logic zero or one. In this way, different frequencies carry different data bits in the same small spatial region, which may increase the storage capacity of the medium by a factor as great as one million. This system of optical data storage is disclosed, for example, in U.S. Pat. Nos. 3,896,420 of Szabo and 4,101,976 of Castro et al.

A problem with this frequency-domain method is the slow speed at which data may be written to the medium. If the single channels, i.e., the spectral "holes," have narrow spectral widths, then a large number of channels (as many as one million) may be fit within the width of the absorption profile. But as the single-channel spectral width decreases, the channel access time—that is essentially the length of time needed to write (or read) data in the channel—increases in inverse proportion to the decrease in spectral width. Thus, in this method the great increase in the amount of data that may be written to a spatial region of the medium must be balanced against the proportionate decrease in the data throughput rate because of the necessity of writing the data to one channel at a time.

This problem was addressed by the coherent time-domain method disclosed, for example, in U.S. Pat. No. 4,459,682 of Mossberg. In this method the storage medium is first subjected to an intense, extremely short preparatory pulse of coherent laser radiation. U.S. Pat. No. 4,459,682 refers to the preparatory pulse as the "fixing" pulse, although it will generally be referred to herein as the "write" pulse. Then a coherent laser beam is amplitude-modulated by the data train desired to be stored. U.S. Pat. No. 4,459,682 refers to the modulated beam carrying the data as the "writing" pulse; however, it has become customary to refer to this pulse as the "data pulse" and that terminology will be used herein. The laser beam modulated with the data pulse train is applied to the local spatial region of the storage medium within a characteristic time span from the preparatory write pulse. The characteristic time span is known as the coherence time or the de-phasing time. It provides a measure of the time span over which the atoms in the local spatial region of the storage medium maintain their coherent state after laser excitation. When applied in this manner, the write pulse and the data pulse interfere with one another, and the resulting interference pattern is recorded in the pattern of selective excitations induced in the storage medium. The interference pattern carries within it the entire data pulse train to be written to the local spatial region. The advantage of this time-domain approach over the earlier frequency-domain approach is that the interference pattern, and hence an entire data signal of a great many data bits, may be written to the local spatial region in roughly the same amount of time it would take to write one channel, or a single data bit, in the frequency-domain approach.

The coherent time-domain approach according to known practice is found to be subject to practical limitations on the storage capacity and data throughput, however. According to the above discussion, the write pulse and data pulse must both be initiated and completed within the characteristic de-phasing time of the storage medium. In practice, however, when a long data pulse (comparable to the de-phasing time) is used to record the data on the storage medium, significant distortion is observed when the stored data signal is later read. In fact, distortion in the retrieved data may be observed long before the length of the data pulse reaches even a small fraction of the de-phasing time. Thus, the known methods of coherent time-domain data storage use a data pulse far shorter than the theoretical maximum and fall far short of the theoretical limit on the number of data bits that may be stored in a local spatial region of the storage medium.

SUMMARY OF THE INVENTION

The present invention provides a method and apparatus for storing data that overcomes the above practical limitations on known approaches to coherent time-domain optical data storage. Briefly, this is achieved by applying spread-spectrum techniques to the data pulse before exposing the storage medium to the data pulse. More specifically, the data signal to be recorded on the store, go medium is subjected to spread-spectrum modulation, and the data pulse of the laser is then modulated with the spread-spectrum modulated data signal. The spread-spectrum modulation may be achieved by modulating the phase of a data pulse train in such a manner that the individual data bits of the data train (or the individual information-containing data segments in a more general form of data signal) appear in the data pulse of the laser to be incoherently superposed. The effect of this modulation is to spread out the energy of the data pulse more evenly over the full data bandwidth, thereby enabling more atoms of the storage material to respond to the data pulse and thereby participate in the data storage. In the embodiment of the invention disclosed here the apparent incoherent superposition of the data is achieved by subjecting the data signal to a pseudo-random phase modulation and then modulating the data pulse with the pseudo-randomly phase-modulated data signal.

Other aspects, advantages, and novel features of the invention are described below or will be readily apparent to those skilled in the art from the following specifications and drawings of illustrative embodiments.

BRIEF DESCRIPTION OF THE DRAWINGS

FIG. 1 is a plot of the power spectrum of a data pulse for a binary data signal according to the known coherent time-domain technique (plot 1A) and according to the new technique of the present invention (plot 1B).

FIG. 2 is a block diagram of apparatus for practicing the invention.

FIG. 3 shows plots of an input data signal (plot 3A), a corresponding echo signal (i.e., the retrieved data pulse) with the present invention (plot 3B), and a corresponding echo signal under comparable conditions without the present invention (plot 3C).

FIG. 4 shows an echo signal (retrieved data pulse) for a 1.6-kilobit data signal of 40-microsecond duration according to the invention.

DETAILED DESCRIPTION OF ILLUSTRATIVE EMBODIMENTS

For a full appreciation of the scope and many embodiments of the present invention, it is beneficial first to discuss the theoretical foundation of the invention. Standard coherent time-domain optical memory systems typically use three laser pulses separated in time to excite an absorbing medium having appropriate spectral properties. As described above, a write pulse and a data pulse are used to write the data to the storage medium. A read pulse is later applied to the medium to read the stored data. Let $E_i(\omega)$ be the Fourier transform of the i-th pulse, where pulse 1 is the write pulse, pulse 2 is the data pulse, and pulse 3 is the read pulse.

The spectral properties of suitable storage media are well known. In overview, the medium includes a material having a populated ground state and undergoing an absorption transition to an excited state having an inhomogeneously broadened absorption profile. The laser pulses are of a suitable frequency to induce the transition to the excited state, generally falling in the infrared, visible, or ultraviolet regions of the spectrum, and have suitably narrow linewidths compared with the inhomogeneously broadened absorption profile. Radiation in the infrared, visible, or ultraviolet regions of the spectrum will generally be referred to herein as optical radiation. Suitable storage materials for use in coherent time-domain data storage will be referred to herein simply as coherent time-domain optical storage materials, and the relation of the spectral properties of the laser pulses and absorbing material for the coherent time-domain storage to take place shall be referred to herein simply as coherent time-domain optical storage relation.

As is well known, the data written to the storage medium is stored by impressing the data upon the frequency profile of the ground state population of atoms in the local spatial region irradiated by the laser pulse. This is achieved in the following manner. The write and data pulses are both applied to the storage medium within the characteristic de-phasing time of the medium. In this circumstance the ground state frequency profile is determined by the coherent superposition of the Fourier transforms representing the write and data pulses:

$$\rho_{gg}(\omega) = 1 - (\mu/2)^2 |E_1(\omega) + E_2(\omega)|^2 \qquad (1)$$
$$= 1 - (\mu/2)^2 [|E_1(\omega)|^2 + |E_2(\omega)|^2 + 2ReE_1^*(\omega)E_2(\omega)]$$

where it is assumed that $$\mu |E_i(\omega)|/n < 1. \qquad (2)$$

The interference between these two pulses is represented by the term $$2ReE_1^*(\omega)E_2(\omega) \qquad (3)$$

in Eq. (1), and it is this term that is impressed upon the absorption profile of the locally irradiated spatial region.

To read the stored data, a read pulse having Fourier transform $E_3(\omega)$ is applied to the medium from the laser. As is well known in connection with coherent time-domain optical memories, the read pulse causes the medium to emit a so-called echo signal having Fourier transform:

$$E_0(\omega) \alpha E_1^*(\omega) E_2(\omega) E_3(\omega) \qquad (4)$$

The echo signal induced by the read pulse will replicate the data pulse $E_2(\omega)$ insofar as the product $E_1^*(\omega)E_3(\omega)$ is approximately flat over the bandwidth of $E_2(\omega)$. In the past this condition has been effectively achieved either by making the write and read pulses sufficiently short (see the article of T. M. Mossberg, Optics Letters, Vol. 77, p. 77 (1982)), or by frequency-chirping the write and read pulses in an identical manner (see Y. S. Bai, W. R. Babbit and T. W. Mossberg, Optics Letters, Vol. 11, p. 724 (1986)), or by phase-modulating the write and read pulses in an identical manner so that their energy is evenly spread over the data pulse bandwidth (see J. M. Zhang, D. J. Gauthier, J. Huang and T. W. Mossberg, Optics Letters, Vol. 16, p. 103 (1991)).

In known coherent time-domain techniques, the coherent superposition of the individual data segments in the data pulse tends to cause the energy of the data pulse to be concentrated in a few narrow spikes within the data bandwidth. FIG. 1 shows the power spectrum of a data pulse according to a known technique (plot 1A) and according to an embodiment of the invention (plot 1B). In plot 1A a data train has been impressed on the laser beam by pure amplitude modulation according to known coherent time-domain techniques. The data train consists of 63 square pulses representing a binary data stream 101010 . . . having 63 "on" bits in a total of 126 bits. The duration of the individual pulses is 25 nanoseconds. The energy is seen to be concentrated in the five spikes making up the plot 1A. With so great a concentration of the data signal's energy under a few peaks, the absorbing atoms in the storage medium excited under these peaks tend to saturate quickly. This saturation prevents the echo signal induced by the read pulse from accurately replicating the stored data.

The present invention avoids the premature saturation effect and overcomes the resultant bottleneck in writing data to the storage medium by effectively spreading out the energy of the laser data pulse over the full data bandwidth. In a nutshell, this is achieved by subjecting the data pulse train to spread-spectrum modulation and then impressing the spread-spectrum data pulse train on the laser data pulse, which is then applied to the storage medium in the customary manner for coherent time-domain data storage. In the embodiment disclosed here the spread-spectrum modulation is achieved by modulating the phase of the data pulse train in such a manner that the individual information-containing data segments (i.e., the data bits in a binary signal) appear to be incoherently superposed. The nature of this phase modulation will be appreciated better after a discussion of apparatus for practicing the invention.

FIG. 2 shows an illustrative optical data storage arrangement in which a single CW laser 10 is used to generate the write, read, and data pulses. The beam from laser 10 is applied to an acousto-optic modulator 11 of known design, which modulates the beam with a modulation signal received from a radio-frequency (rf) modulator 12. The rf-modulated beam is applied to the storage medium 13 after passing through an optical arrangement 14 (illustrated diagrammatically in FIG. 2) for focusing the beam onto the storage medium and controlling the spot size. An X-Y scanner 16 and shutter mechanism 17 are interposed for directing the beam to a desired spatial address on storage medium 13 so as to write to or read from a selected address location. The read pulse reflected from the storage medium and the echo signal from the medium are received at detector 18, which provides an output data signal. Mechanisms for controlling the laser, controlling the spot size of the beam, addressing, and receiving the optical response of the storage medium to the read pulse are well known and thus need not be described in further detail here.

A data train containing a plurality of data bits to be written on the storage medium is applied to node 21. In general the present technique is not limited to use with binary data trains, and where reference is made to data bits, it is to be understood that other information-containing data segments may be substituted. In accordance with the invention the phase relationship of the data train is varied in a manner such that it appears to be random, at least over the period of time that the write operation takes place. The result is that the individual bits in the laser beam data pulse appear to be incoherently superposed. In the embodiment of FIG. 2 the phase modulation is produced by the combination of an oscillator 22 which provides a fixed frequency signal, a bi-phase shift key 23 which keys the signal from oscillator 22, and a pseudo-random sequence generator 24 which controls shift key 23. Generator 24 provides a pseudo-random sequence for phase-modulating the data train. A pseudo-random sequence is one that appears random on the time scale of interest but in reality is not random at all. Here the sequence repeats itself, but only much later than the length of the data train, so that to the data train the sequence appears to be random. The data pulse train at node 21 is subjected to the pseudo-random phase modulation through switch 25, which applies the modulated data train to a signal combiner 26, which in turn applies the data modulation signal, as well as read and write frequency-chirping signals described below, to acousto-optic modulator 11. The amplitude of the data-modulated beam is unchanged, but the phase relationship of the data train is different and appears to be random, at least over the period of time that the write operation takes place. As a result the spectral shape of the data pulse is broadened out, and the spikes prevalent in the prior art no longer appear. In essence, the data pulse is given a generally evenly distributed frequency spectrum in the sense that the atoms of the storage medium responsive to the frequency spectrum are not concentrated in narrow peaks where they tend to saturate, but are spread out over the frequency spectrum to a sufficient degree that saturation of the absorption transition used to record the data on the storage medium is substantially avoided.

Plot 1B in FIG. 1 shows the power spectrum according to the invention for the same data signal as plot 1A. The spectrum of plot 1B was generated by synchronous M-sequence pseudorandom bi-phase shifting of the data signal in addition to the amplitude modulation. When the pseudorandom bi-phase shifting and the amplitude modulation are at an identical rate, the spectrum of the data pulse is essentially an incoherent superposition of the spectra of all individual bits with a relative fluctuation of $\sim 1$. The envelope of the central bump of the spread spectrum is essentially a single 25-nanosecond pulse spectrum expanded by a factor of 63. The central spike of plot 1A is roughly 63 times higher than the central bump of plot 1B, while the areas under the two profiles are the same.

In this manner all the atoms in the locally irradiated spatial region of the storage medium responsive to any portion of the frequency band participate in the storage of information. While pseudo-random techniques, and in particular pseudo-random bi-phase shifting, have been used in spread-spectrum communications before, their usefulness in overcoming the writing bottleneck problem in coherent time-domain optical memories has not been appreciated.

The embodiment of FIG. 2 uses a frequency chirping technique for the read and write pulses departing from the conventional technique. Frequency chirping is conventionally achieved in coherent time-domain optical memory systems and other applications as well by modulating the length of the laser cavity and hence the resulting frequency of the laser beam. Lasers tend to become unstable with changes in cavity length without added measures to assure stability, however, so that in a practical system the laser-cavity modulation approach necessarily represents a compromise between the system stability and the cost of extra stabilizing safeguards. In FIG. 2 the frequency chirping is provided by a voltage-controlled oscillator (VCO) 27 independent of the laser. VCO 27 provides a ramped signal used to generate a frequency-chirping signal for modulating the read and write pulses. VCO 27 is coupled through switch 28 to signal combiner 26, which applies the respective read and write frequency-chirping signals to acousto-optic modulator 11. The modulator 11 then modulates the beam directly with the frequency-chirping signal to produce the frequency-chirped read and write laser pulses. Direct modulation of the beam by means of VCO 27 and acousto-optic modulator 11 provides for a more stable device and in addition avoids the need for high voltage and associated circuitry normally required to modulate the laser cavity length. The VCO approach uses low voltage and provides for a more practical and lower-cost system.

The enhanced storage capacity achievable with the invention is demonstrated by the test results shown in FIGS. 3 and 4. The test data were obtained by investigating the 579.88-nanometer transition ($^7F_0 - ^5D_0$, site 1) of a 0.1 atomic percent $Eu^{3+}$:YOS($Y_2SiO_5$) crystal as the storage medium. The transition was found to have an inhomogeneous broadening of 3.6 GHz, an optical density of 1.0 at the line center (l=7.5 millimeters), and an oscillator strength of about $5 \times 10^{-8}$. The frequency of the laser was tuned to one side of the inhomogeneous line where the linear absorption is about 20%, corresponding to an optical density of 0.1. The two-pulse echo de-phasing time measured under these conditions with very weak input pulse energy flux of 0.8 micro Joules per square centimeter per pulse was found to be greater than or equal to about 800 microseconds. The data signal was a binary encoded pulse train with a rate of 40 Megabits/second. The laser pulses were focused onto the sample storage medium with a beam waist of 80 micrometers and a power of about 100 milliWatts.

The pseudo-random sequence generator was provided by an eleven-stage shift register (of 2047 bits) with an XNOR feedback running synchronously with the amplitude modulation of the data at 40 Megabits/second, giving an effective data bandwidth of 80 MHz. The write and read pulses were frequency-chirped and had an identical duration of 6 microseconds. VCO 27 provided a frequency chirping signal ramped over a range of 44 MHz around the rf carrier frequency. The laser beam was double-passed through the acousto-optic modulator to compensate for the beam displacement associated with the frequency shift so that the effective frequency chirp on the optical pulses was 88 MHz. Thus the rf phase shift applied to the data pulse was only 0–90 degrees instead of 0–180 degrees.

The echo signal from the sample was detected by a photomultiplier tube and for the purposes of demonstration was recorded on a single-event basis by a digitizing oscilloscope. After each measurement the laser was shifted 110 MHz. The power of the observed echo signal was about 0.01 percent of the input data pulse power when the storage time ($t_{32}$) was shorter than the excited-state lifetime (about 2 milliseconds). Echo signals with large storage time $t_{32}$ were about thirty times smaller.

The improvement achieved with the present invention may be seen in FIGS. 3 and 4. Plot 3A in FIG. 3 is a portion of a ten-microsecond input data pulse of 400 bits corresponding to the binary code sequence 1010001010 ... 10. Plot 3B is a comparable portion of the echo signal (i.e., the retrieved data pulse) with the present invention. Note the clear one-to-one correspondence between the input and output bits of plots 3A and 3B, which was observed throughout the entire data pulse. The pronounced advantages of the invention are seen by comparison with Plot 3C, which is an echo signal for the same input data signal as shown in plot 3A recorded without using the pseudo-random bi-phase shift keying of the invention, but with all other experimental conditions the same as in plot 3B. Plot 3C illustrates the degradation in the echo pulse, and eventual loss of data, in the known coherent time-domain techniques for a long input data pulse caused by premature saturation of the storage medium.

FIG. 4 shows an echo signal (retrieved data pulse) for a 1.6-kilobit data signal of 40-microsecond duration.

The decay exhibited in the profile of the retrieved data corresponds to a de-phasing time of about 200 microseconds, and it is apparent that a significantly longer data pulse could be retrieved within the de-phasing time without loss of data from saturation or other effects. As mentioned above, the separation between the frequency channels in this test was 110 MHz, which results in about 32 frequency channels on the 3.6-GHz inhomogeneous spectral width. The storage capacity inferred with the parameters of the illustrated test results is thus about $5 \times 10^4$ bits per spatial spot. These test results are described here merely to demonstrate the feasibility of the method and it is emphasized that the parameters used in the illustrated tests have not been optimized for maximum storage capacity, which may generally be greater than that in the illustrated tests.

The above descriptions and drawings disclose illustrative embodiments of the invention. Given the benefit of this disclosure, those skilled in the art will appreciate that various modifications, alternate constructions, and equivalents may also be employed to achieve the advantages of the invention. For example, other optical arrangements with more than one laser for generating the write, read and data pulses may be used. Other pseudo-random sequences may be used as well as other arrangements for realizing the modulations. Therefore, the invention is not to be limited to the above description and illustrations, but is defined by the appended claims.

What is claimed is:

1. Optical data storage apparatus including a coherent time-domain optical storage material and at least one laser for providing a data pulse of optical radiation in coherent time-domain optical storage relation with said material, said apparatus comprising:

means for receiving a data signal corresponding to a plurality of information-containing data segments;

means for providing a spread-spectrum modulation signal;

first modulation means for modulating the data segments of said data signal according to said spread-spectrum modulation signal; and second modulation means responsive to said first modulation means for modulating said data pulse with the spread-spectrum modulated data signal.

2. The apparatus of claim 1 wherein said means for providing a spread-spectrum modulation signal comprises a pseudo-random sequence generator for providing a pseudo-random modulation sequence;

said first modulation means modulates the data segments of said data signal according to said pseudo-random modulation sequence; and said second modulation means modulates said data pulse with the pseudo-randomly modulated data signal.

3. The apparatus of claim 2 wherein said first modulation means comprises:

an oscillator providing a fixed frequency signal; and bi-phase shift key means for keying said fixed frequency signal responsive to said pseudo-random sequence generator.

4. The apparatus of claim 1 including means for providing a write pulse and a read pulse of optical radiation in coherent time-domain optical storage relation with said material, said apparatus further comprising:

a voltage-controlled oscillator providing a frequency-chirping signal; and means for frequency-chirping said write and read pulses responsive to said frequency-chirping signal.

5. In a method of storing a data signal corresponding to a plurality of information-containing data segments in an optical storage medium, said medium comprising a coherent time-domain optical storage material and said method comprising the steps of modulating a data pulse of coherent optical radiation with said data signal, exposing said material to a write pulse of optical radiation in coherent time-domain optical storage relation with said material, and exposing said material to said data pulse in coherent time-domain optical storage relation with said material, wherein said material is exposed to said write and data pulses within a period of time no greater than a characteristic de-phasing time of said material, the improvement comprising the steps of:

subjecting said data signal to spread-spectrum modulation; and modulating said data pulse with the spread-spectrum modulated data signal, whereby said material is exposed to a data pulse having a generally evenly distributed frequency spectrum.

6. The method of claim 5 wherein said spread-spectrum modulation comprises pseudo-random phase modulation; and said data pulse is modulated with the pseudo-randomly phase-modulated data signal.

7. The method of claim 6 wherein said pseudo-random phase modulation comprises bi-phase modulation.

* * * * *